United States Patent
Butler et al.

(10) Patent No.: US 10,409,175 B2
(45) Date of Patent: Sep. 10, 2019

(54) LITHOGRAPHIC APPARATUS AND DEVICE MANUFACTURING METHOD

(71) Applicant: ASML Netherlands B.V., Veldhoven (NL)

(72) Inventors: Hans Butler, Veldhoven (NL); Cornelius Adrianus Lambertus De Hoon, Veldhoven (NL); Marc Wilhelmus Maria Van Der Wijst, Veldhoven (NL); Thijs Verhees, Veldhoven (NL); Sander Kerssemakers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/027,986

(22) PCT Filed: Oct. 22, 2014

(86) PCT No.: PCT/EP2014/072590
§ 371 (c)(1),
(2) Date: Apr. 7, 2016

(87) PCT Pub. No.: WO2015/062921
PCT Pub. Date: May 7, 2015

(65) Prior Publication Data
US 2016/0238953 A1      Aug. 18, 2016

Related U.S. Application Data

(60) Provisional application No. 61/897,072, filed on Oct. 29, 2013.

(51) Int. Cl.
*G03B 27/42* (2006.01)
*G03F 7/20* (2006.01)

(52) U.S. Cl.
CPC .......... *G03F 7/70775* (2013.01); *G03F 7/709* (2013.01); *G03F 7/70766* (2013.01); *G03F 7/70833* (2013.01)

(58) Field of Classification Search
CPC .. G03F 7/70775; G03F 7/70725; G03F 7/709; G03F 7/7085; G03F 7/70716;
(Continued)

(56) References Cited

U.S. PATENT DOCUMENTS

| 5,187,519 A | 2/1993 | Takabayashi et al. |
| 8,164,737 B2 | 4/2012 | Butler et al. |

(Continued)

FOREIGN PATENT DOCUMENTS

| EP | 1 780 772 | 5/2007 |
| JP | 2001-304332 | 10/2001 |

(Continued)

OTHER PUBLICATIONS

International Search Report and Written Opinion dated Dec. 22, 2014 in corresponding International Patent Application No. PCT/EP2014/072590.
(Continued)

*Primary Examiner* — Mesfin T Asfaw
(74) *Attorney, Agent, or Firm* — Pillsbury Winthrop Shaw Pittman LLP (57) ABSTRACT

A lithographic apparatus includes a base frame, an illumination system configured to condition a radiation beam and supported by the base frame, a support constructed to support a patterning device, the patterning device being capable of imparting the radiation beam with a pattern in its cross-section to form a patterned radiation beam, a substrate table constructed to hold a substrate, a projection system configured to project the patterned radiation beam onto a target portion of the substrate, a positioning device config-
(Continued)

ured to position the substrate table, the positioning device being supported by the base frame, a sensor configured to sense a vibration caused by a torque exerted on the base frame, and an actuator configured to exert a force on the illumination system or the base frame, in response to the sensed vibration, in order to at least partly dampen the vibration.

20 Claims, 4 Drawing Sheets

(58) Field of Classification Search
    CPC ............. G03F 7/70975; G03F 7/70758; G03F 7/70833; G03F 7/70516; G03F 7/707; G03F 7/70766; G03F 7/70825
    See application file for complete search history.

(56) References Cited

U.S. PATENT DOCUMENTS

| | | | |
|---|---|---|---|
| 2005/0041233 A1* | 2/2005 | Van Schothorst | G03F 7/709 355/72 |
| 2007/0279644 A1* | 12/2007 | Teun Plug | G03F 7/70758 356/625 |
| 2009/0122284 A1 | 5/2009 | Butler et al. | |
| 2009/0153832 A1* | 6/2009 | Tatsuzaki | G03F 7/709 355/72 |
| 2009/0262325 A1* | 10/2009 | Butler | G03F 7/70758 355/72 |
| 2013/0044306 A1 | 2/2013 | Emoto et al. | |

FOREIGN PATENT DOCUMENTS

| | | |
|---|---|---|
| JP | 2005-109441 | 4/2005 |
| JP | 2007-120646 | 5/2007 |
| JP | 2009-105398 | 5/2009 |
| JP | 2010-080624 | 4/2010 |
| JP | 2011-124292 | 6/2011 |
| JP | 2013-041981 | 2/2013 |

OTHER PUBLICATIONS

Japanese Office Action dated Mar. 7, 2017 in corresponding Japanese Patent Application No. 2016-527191.

Japanese Office Action dated Oct. 31, 2017 in corresponding Japanese Patent Application No. 2016-527191.

U.S. Office Action issued in corresponding U.S. Appl. No. 16/219,449, dated May 13, 2019.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2014/072590, which was filed on Oct. 22, 2014, which claims the benefit of priority of U.S. provisional application No. 61/897,072, which was filed on Oct. 29, 2013 and which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure proper operation of the integrated circuits that are manufactured by the successive patterning process (note that an IC may comprise up to 30 or more successive layers) an accurate alignment of successive layers needs to be performed. An important condition to realize such an accurate alignment is to make sure that a positioning of the substrate relative to the patterning device (or reticle) is controlled as accurately as possible. To facilitate this, vibrations of the structures supporting the substrate or patterning device, the projection system or the illumination system should be avoided or suppressed.

During a typical exposure cycle, both the substrate and the patterning device undergo significant accelerations. In order to generate such accelerations, powerful positioning devices, typically including a plurality of electromagnetic actuators, linear or planar motors, are applied to exert the appropriate forces to the support structures of the substrate and the patterning device. As will be understood by the skilled person, when acceleration or deceleration forces are applied to such support structures, equal and opposite reaction forces are generated as well. When such reaction forces would be exerted on a stationary frame of the lithographic apparatus, significant vibrations would be generated throughout the apparatus, thus adversely affecting the accuracy of the exposure process. In order to avoid the generation of such vibrations, a balance mass arrangement is typically applied, whereby the reaction forces are not applied to a stationary frame but to a counter mass which is configured to displace in a substantially frictionless manner relative to the stationary frame or frames of the apparatus. By using such a balance mass arrangement, the direct application of significant reaction forces on the lithographic apparatus can be avoided. However, it has been found that such a balance mass arrangement may also be the cause of torque components exerted on the stationary frames and structures of the lithographic apparatus. In particular, it has been found that the illuminator or illuminator module of a lithographic apparatus is susceptible to such components, and may thus suffer from vibrations caused by such torque components. As a result, the illuminator or illuminator module may displace relative to the patterning device, the projection system or the substrate, adversely affecting the exposure process.

SUMMARY

It is desirable to provide a lithographic apparatus that is less susceptible to vibrations caused by balance mass arrangements as typically applied.

According to an aspect of the invention, there is provided a lithographic apparatus comprising: a base frame; an illumination system configured to condition a radiation beam and supported by the base frame; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a positioning device configured to position the substrate table, the positioning device being supported by the base frame; the apparatus further comprising: a sensor configured to sense a vibration caused by a torque exerted on the base frame and, an actuator configured to exert a force on the illumination system or the base frame, in response to the sensed vibration, in order to at least partly dampen the vibration.

According to another aspect of the invention, there is provided a device manufacturing method comprising projecting a patterned beam of radiation onto a substrate, using a lithographic apparatus according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
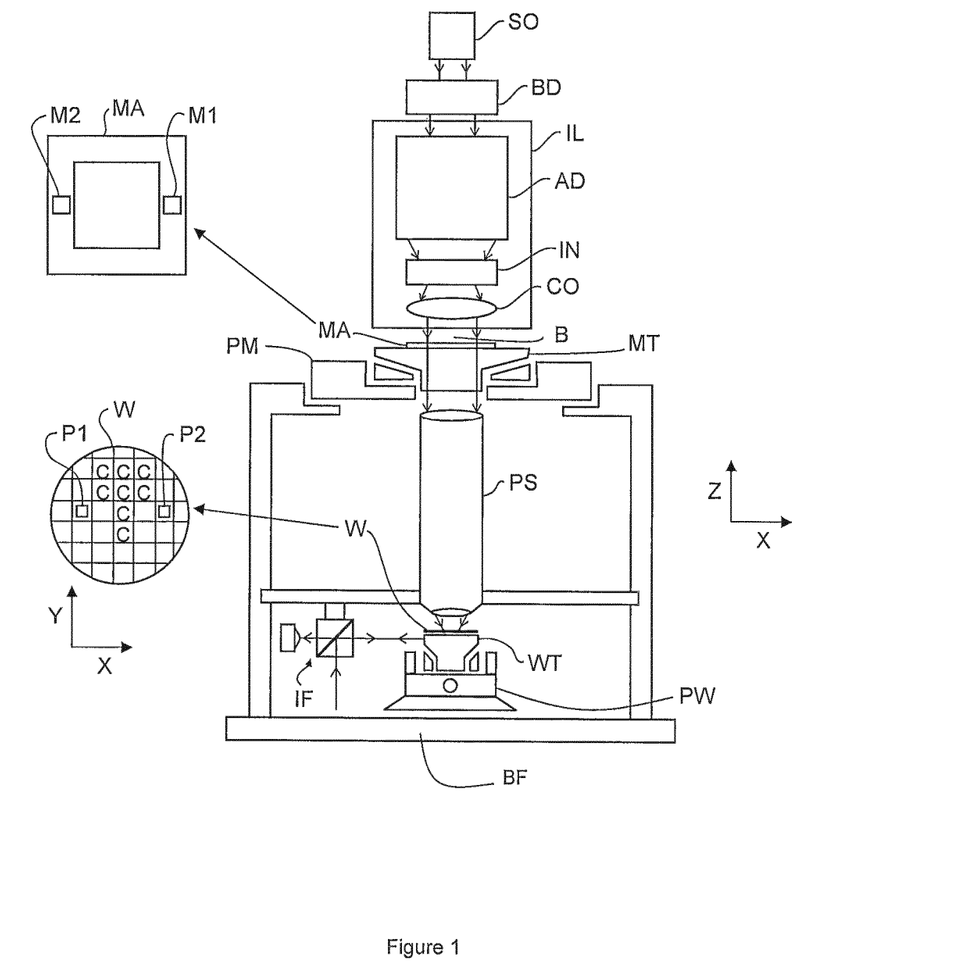
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW.

In accordance with an embodiment of the present invention, the second positioner PW may have a balance mass configuration, as will be explained in more detail below. Such a balance mass configuration may result in torques being exerted on the base frame BF of the apparatus, whereby the torques induce displacements, i.e. vibrations of e.g. the illuminator IL (which is typically mounted to or supported by the base frame) or a so-called reticle handling module, which is applied to transport patterning devices (also referred to as masks or reticles) to and from the support structure (e.g. mask table) MT.

In order to mitigate the effects of such displacements or vibrations, an aspect of the present invention proposes to counteract such displacements by exerting a force, e.g. using an electromagnetic actuator, on the base frame or the affected structure such as the illuminator. In an embodiment, the force is applied to the base frame or the affected structure directly. Alternatively, the force may be applied via an intermediate mass.

When a force is exerted on the base frame or the affected structure, an equal and opposite reaction force is generated as well. In an embodiment of the present invention, such a reaction force is exerted on a reaction mass. In an embodiment, such a reaction mass can e.g. be freely suspended.

As an alternative, in an embodiment, a balance mass, e.g. a balance mass of a balance mass configuration or the first or second positioning PW, PM may be configured as a reaction mass for the actuator exerting the force on the base frame or the affected structure.

In the case of a stepper (as opposed to a scanner) the support structure (e.g. mask table) MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
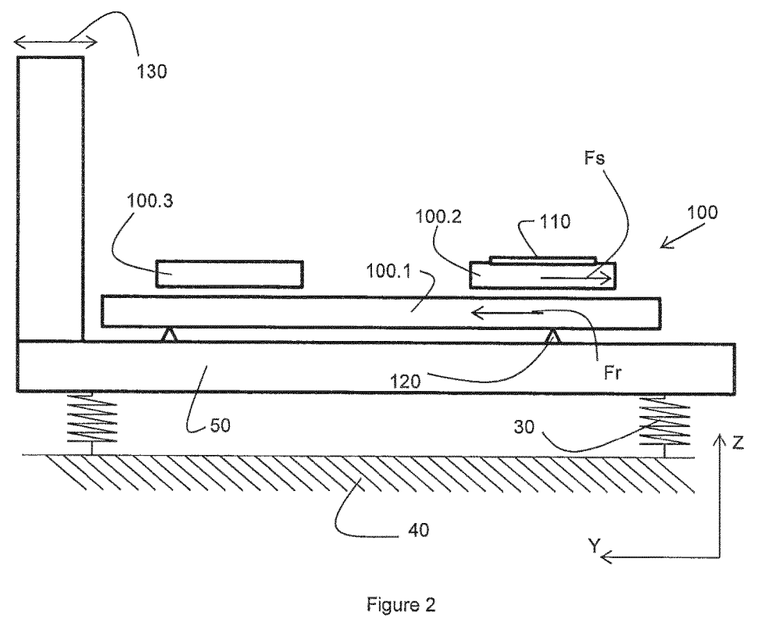
FIG. 2 depicts a positioning device comprising a balance mass configuration as can be applied in a lithographic apparatus according to an embodiment of the invention.

In FIG. 2, a positioning device 100 as can be applied in a lithographic apparatus according to an embodiment of the invention is schematically shown. FIG. 2 schematically shows a base frame 50 that is mounted to a floor 40, reference number 30 referring to the limited stiffness of the base frame itself and the floor to which it is mounted. The positioning device 100 as shown comprises a planar motor, i.e. a two-dimensional electromagnetic motor for positioning a first 100.2 and second 100.3 table. The electromagnet motor comprises a first member 100.1, e.g. a magnet plate that may comprise a 2D pattern of alternatingly magnetized permanent magnets (not shown) and a second member, e.g. comprising a coil assembly (not shown) which is mounted to the first and second table, for co-operating with the first member 100.1. In an embodiment, both tables may be configured to support a substrate. In an alternative embodiment, one table may be configured as a substrate table, whereas the other table is configured as a calibration stage. The electromagnet motor is configured to generate forces in a horizontal plane, perpendicular to the Z-direction to displace the substrate 110 or calibration stage relative to a projection system or measurement system (not shown), by means of a co-operating between the first member and the second member. The coil assembly may comprise a 2D pattern of coils that can be energized.

In an alternative embodiment, the first member 100.1 of the two-dimensional electromagnetic motor comprises a coil assembly, e.g. comprising a 2D pattern of coils that can be energized. In such embodiment, the second member of the electromagnet motor may comprise a magnet plate that may comprise a 2D pattern of alternatingly magnetized permanent magnets, the magnet plate being mounted to the substrate table(s) or the calibration stage (100.2, 100.3). In an embodiment, the magnet plate and/or the coil assembly of the two-dimensional electromagnetic motor may be asymmetric with respect to the X- and Y direction, i.e. both directions in the horizontal plane. By doing so, the electromagnetic motor may have different properties, e.g. with respect to available force (and thus acceleration) in the X and Y-direction. By providing the electromagnetic motor with an asymmetric profile in either the magnet pattern or the coil assembly, an increased acceleration in the scanning direction (e.g. the Y-direction) can be obtained, compared to an acceleration in the step direction (e.g. the X-direction). Such asymmetrical properties of the electromagnetic motor may e.g. be obtained by applying asymmetrically shaped magnets (e.g. rectangular shaped instead of square shaped), applying magnets or different size, applying coils of different size in X- and Y-direction, etc.

In the embodiment as shown, the positioning device 100 has a balance mass configuration, whereby the first member 100.1 is free to move in the XY-plane by e.g. application of an air bearing 120 between the first member 100.1 and the base frame 50. FIG. 2 further illustrates a force Fs generated by the positioning device and the corresponding reaction force Fr occurring on the first member 100.1. By applying the balance mass configuration, the reaction force Fr is not readily applied to the base frame 50. However, because the substrate table 100.2 and the magnet plate 100.1 are not operating in the same horizontal plane, a torque is generated which is exerted on the base frame 50, via the air bearing 120. In case of the forces as shown, a torque Tx about the X-axis (perpendicular to the YZ-plane) is generated. Such a torque Tx may result in displacements in the Y-direction of structures that are mounted to the base frame 50, as schematically illustrated by the arrow 130. In a similar manner, when a force is exerted in the X-direction on any of the tables 100.2 or 100.3, this force, combined with the corresponding reaction force, a torque Ty is generated about the Y-axis, which can generate displacements of structures on the base frame 50 in the X-direction.

Due to the occurrence of the torque components Tx, Ty, various problems may arise.

Figure 3:
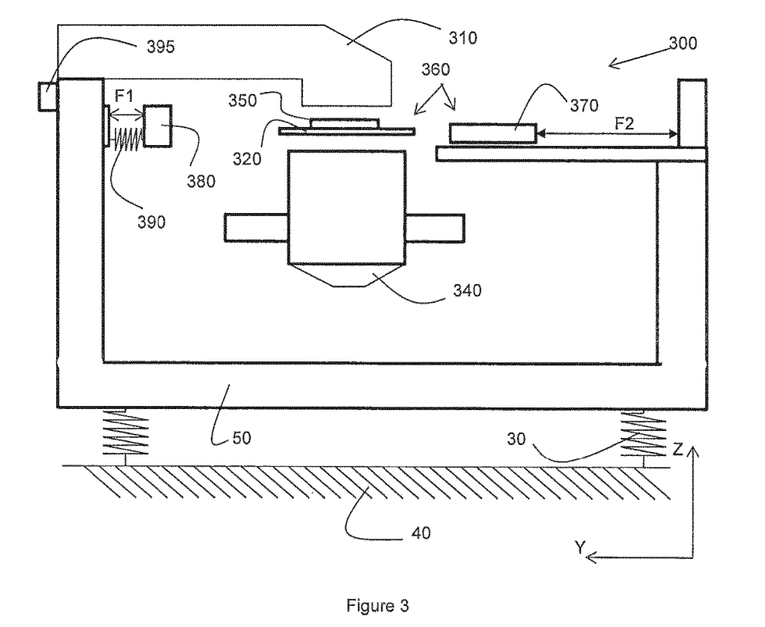
FIG. 3 depicts a lithographic apparatus according to a further embodiment of the present invention.

FIG. 3 schematically illustrates the lay-out of a lithographic apparatus 300, schematically showing an illuminator module 310 and a patterning device support 320. FIG. 3 further shows a projection system 340 which is vibrationally isolated from the base frame (isolation not shown). In order to position the patterning device 350, which is mounted to the support 320, a positioning device 360 is provided, the positioning device having a balance mass configuration, whereby the balance mass 370 is mounted to the base frame 50.

As described above, due to the scanning actions of the substrate support structure, torque components Tx, Ty may occur which result in displacements in both X and Y direction of the structures mounted to the base frame 50, such as the illuminator 310 or an interface module (a so-called reticle handler) for transporting patterning devices to and from the patterning device support 320.

In particular, it has been devised by the inventors that the occurring displacements in the Y-direction (of the illuminator 310) may adversely affect the position of the conditioned radiation beam B as provided to the patterning device. In particular, it has been noted that, when a relative displacement occurs between the illuminator 310 and the patterning device, during the exposure process, a non-uniformity occurs with respect to the amount of radiation (also referred to as the illumination dosage) as provided by the radiation beam B to the patterning device. Due to the vibrations of the illuminator, different parts of the patterning device, i.e. different parts of the pattern that needs to be transferred, may receive a different illumination dosage. When different parts of the patterning device receive a different illumination dosage, this will affect the exposure process on the substrate. As an example, the inventors have devised that the CD (critical dimension) uniformity, a parameter which can be considered a measure for the quality of the exposure process, may adversely be affected.

With respect to the occurring displacements in the X-direction, caused by a torque component Ty, it has been noted that such displacements may adversely affect the accurate positioning of the patterning device 350 onto a patterning device support 320 by an interface module such as a reticle handler.

With respect to the occurring vibrations and displacements, it is further worth noting that these vibrations are caused by the excitation of a few vibration modes, typically between 10 and 30 Hz. It has been observed that the eigen modes or eigen frequencies of the base frame and structures that are mounted to the base frame (such structures e.g. supporting an illumination system or a patterning device exchange module) are typically found in this range. The base frame and structures mounted to the base frame are thus susceptible to torques or forces exerted in said frequency range, e.g. due to a balance mass configuration as described above.

In an embodiment of the present invention, various options are proposed to mitigate the above described effects.

As a first option, the lithographic apparatus according to an embodiment of the invention comprises a sensing device or sensor configured to sense a vibration caused by the balance mass configuration and, an actuator configured to exert a force on the illumination system or the base frame, in response to the sensed vibration, in order to at least partly dampen the vibration. As a sensor, an accelerometer may e.g. be applied. Further, an actuator is provided (e.g. an electromagnetic actuator or a piezo-electric actuator) for exerting a force onto the base frame or the illumination system, in order to dampen the vibration. In FIG. 3, such an arrangement is schematically shown. At or near the top of the illuminator module 310, an actuator is mounted, the actuator being represented by the force F1. The force F1 may thus be exerted onto the illuminator module 310 or to the structure supporting the module, i.e. the base frame 50. A reaction mass 380 is further provided to receive the reaction force as generated by the actuator. This reaction mass is freely suspended via a suspension 390, which may e.g. include one or more springs. Further, a sensor or sensing device 395 is schematically shown, the sensor e.g. providing a signal representative of the occurring vibrations or displacements which are caused by the torque as exerted on the base frame. Such a representative signal may e.g. be obtained from a velocity or acceleration sensor. The sensor signal may thus be applied to control the actuator.

In an embodiment, several of such arrangements (including actuators, sensors, reaction masses) are mounted at different locations at or near the top of the illuminator or to the supporting structure, thereby enabling different vibration modes (e.g. both modes in the X and Y direction) to be dampened.

Because of the comparatively low frequencies of the vibration modes that need to be dampened or counteracted, a comparatively large reaction mass 380 may be required. In an embodiment of the present invention, a balance mass of a positioning device of the lithographic apparatus is applied as a reaction mass for the actuator. Typically, both the positioning devices of the patterning device and the substrate (also referred to as the first and second positioners PM and PW in FIG. 1) are provided with a balance mass configuration. When such an arrangement is available, the balance mass of the balance mass configuration may be applied as counter mass or reaction mass.

Such an arrangement is also schematically shown in FIG. 3. In FIG. 3, an actuator (represented by the force F2) is schematically shown, the actuator exerting a force F2 onto the base frame, whereas a reaction force is exerted on the balance mass 370 of the positioning device 360 of the patterning device 350. In such an arrangement, there is no need for a separate reaction mass, since the already present balance mass of the positioning device 360 may be applied.

By exerting a force F2 as indicated, vibrations resulting in displacements in the Y-direction, such displacements e.g. affecting the uniformity of the illumination dosage as provided by the illuminator, can be mitigated. In general, a balance mass configuration of a patterning device is configured to displace in the scanning direction (e.g. the Y-direction). As such, in order to dampen or counteract displacements in non-scanning direction (e.g., the X-direction), an arrangement such as the actuator indicated by the force F1 can be applied.

As an alternative, or in addition, a balance mass of a positioning device for positioning the substrate may equally be applied as a reaction mass. Other balance masses which may be applied in the lithographic apparatus, e.g. a balance mass as applied in a positioning device of a reticle masking unit of the illumination system, may be used as well as a reaction mass.

Figure 4:
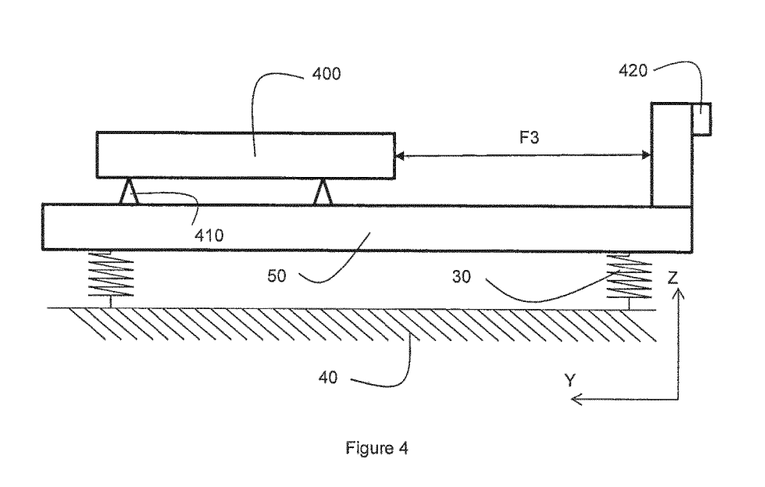
FIG. 4 depicts an actuator-sensor arrangement co-operating with a balance mass.

A detail of such an arrangement is schematically shown in FIG. 4. FIG. 4 schematically shows a base frame 50 which is supported on a ground or floor 40, via connection stiffness 30 indicating the limited stiffness of the base frame and floor. FIG. 4 further shows part of a balance mass 400 (similar to balance mass 100.1 of FIG. 2) which can be part of a balance mass configuration of a positioning device for positioning a substrate, the balance mass 400 being supported by the base frame via an air bearing 410 or the like (e.g. leaf springs). Indicated by F3, is an actuator force exerted on the base frame 50, whereby a reaction force is exerted on the balance mass 400, the balance mass is thus acting as a reaction mass. The force F3 enables to dampen vibrations of the base frame 50, that are due to the exertion of the torque components Tx and Ty as described above. As a sensing device or sensor, e.g., an accelerometer 420, can be mounted to the base frame.

In the arrangement as shown, a force F3 is exerted in the Y-direction onto the base frame. In a similar manner, a force may be exerted in the X-direction, as in general, a balance mass of a substrate positioning device is substantially free to move in at least both X and Y-direction.

Figure 5:
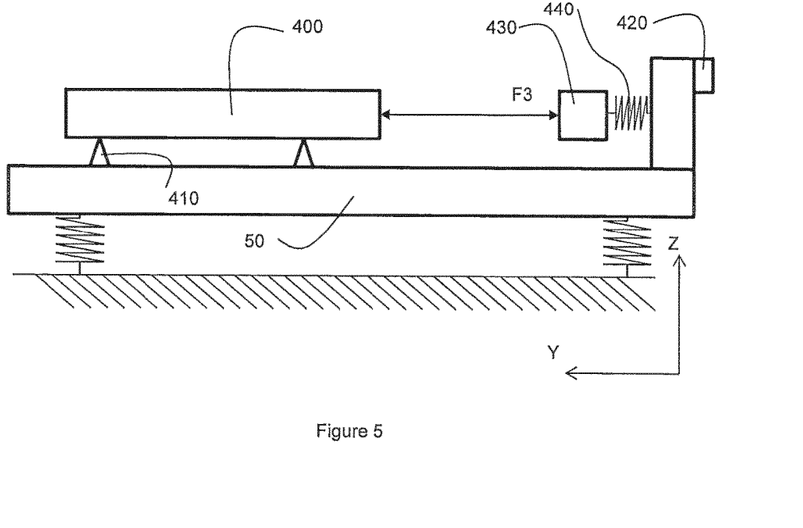
FIG. 5 depicts a further actuator-sensor arrangement co-operating with a balance mass.

In an embodiment of the present invention, the force as exerted by the actuator (e.g. force F1, F2 or F3) is not directly applied to the base frame or illuminator but indirectly, via an interface mass that is mounted to the base frame or illuminator. This is schematically illustrated in FIG. 5.

Compared to FIG. 4, the actuator force F3 is applied to the base frame 50 via an interface mass 430 which is mounted to the base frame 50 via a damping member, i.e. a compressible or flexible connection 440, e.g. a spring or a rubber or rubber-like component. Applying the force F3 via the interface mass provides in a filtering of the applied force.

In a similar manner, an interface mass and damping member may also be applied to exert the forces F1 or F2 onto the illuminator or base frame.

In an embodiment, the lithographic apparatus according to the present invention further comprises a control unit or controller configured to receive a sensor signal from the sensor, process the sensor signal to derive an actuator control signal using a control loop and output the actuator control signal to control the actuator. In an embodiment, the controller may include one or more filters to improve the stability of the control loop. In particular, the application of a low-pass filter may enable that a too large excitation of the reaction mass is avoided and application of a high-pass filter may reduce the impact of low frequency noise of the sensing device.

In an embodiment, the sensor, e.g. an accelerometer, is mounted in line with the force as exerted by the actuator. In this respect, it has been devised by the inventors that, when the sensor and the actuator are mounted at a substantial distance apart, this may adversely affect the stability of the control loop of the controller. As such, it is desirable to mount the sensor at or near the actuator. In an embodiment, the sensor and the actuator are co-located. As an example, referring to the embodiment of FIG. 5, the sensor or sensing device 420 could be mounted to the interface mass 430.

In addition to, or as an alternative, a control loop of the controller may include a low pass filter to improve the stability of the control loop.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a base frame;
   an illumination system configured to condition a radiation beam and supported by the base frame;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate;
   a positioning device configured to position the substrate table, the positioning device being supported by the base frame and comprising a balance mass configuration, the balance mass configuration comprising a balance mass movable relative to the substrate table and configured to receive a reaction force arising from movement of the substrate table by the positioning device;
   a sensor configured to sense a vibration caused by a torque exerted on the base frame, the torque being caused by the balance mass configuration; and
   an actuator configured to exert a force on the illumination system or the base frame, in response to the sensed vibration, in order to at least partly dampen the vibration.

2. The lithographic apparatus according to claim 1, wherein the sensor is substantially arranged in line with the force exerted by the actuator.

3. The lithographic apparatus according to claim 1, wherein the actuator and the sensor are substantially co-located.

4. The lithographic apparatus according to claim 1, wherein the actuator comprises a first member mounted to the illumination system and a second member that is freely suspended and configured as a reaction mass.

5. The lithographic apparatus according to claim 4, wherein the first member of the actuator is mounted to the illumination system via an interface mass and a damping member.

6. The lithographic apparatus according to claim 1, comprising a plurality of sensors configured to sense the vibration and a respective plurality of actuators configured to exert a force on the illumination system or base frame in response to the sensed vibration.

7. The lithographic apparatus according to claim 1, wherein the balance mass of the balance mass configuration is configured as a reaction mass of the actuator.

8. The lithographic apparatus according to claim 7, wherein the balance mass comprises a magnet plate of the positioning device, the magnet plate comprising a two-dimensional pattern of permanent magnets.

9. The lithographic apparatus according to claim 7, wherein the balance mass comprises a coil assembly of the positioning device, the coil assembly comprising a two-dimensional pattern of coils.

10. The lithographic apparatus according to claim 7, wherein the actuator comprises a first actuator configured to exert a force in a first horizontal direction and a second actuator configured to exert a force in a second horizontal direction, the second horizontal direction being substantially perpendicular to the first horizontal direction.

11. The lithographic apparatus according to claim 1, comprising a further positioning device configured to position the support, the further positioning device having a further balance mass configuration, and wherein a balance mass of the further balance mass configuration is configured as a reaction mass of the actuator.

12. The lithographic apparatus according to claim 1, wherein the sensor is configured to sense vibrations caused by the torque, in a range of 5 to 30 Hz.

13. The lithographic apparatus according to claim 1, wherein the actuator comprises an electromagnetic actuator.

14. The lithographic apparatus according to claim 1, further comprising a controller configured to receive a sensor signal from the sensor, process the sensor signal to derive an actuator control signal and output the actuator control signal to control the actuator.

15. The lithographic apparatus according to claim 14, wherein a control loop of the controller comprises a filter to improve a stability of the control loop.

16. A device manufacturing method comprising:
    conditioning a radiation beam using an illumination system that is supported by a base frame;
    imparting the radiation beam with a pattern in its cross-section to form a patterned radiation beam using a patterning device;
    projecting the patterned radiation beam onto a target portion of a substrate;
    positioning a substrate table holding the substrate using a positioning device supported by the base frame;
    receiving at least part of a reaction force arising from the positioning of the substrate table by a balance mass of a balance mass configuration, the balance mass movable relative to the substrate table;
    sensing a vibration caused by a torque exerted on the base frame, the torque is being caused by the balance mass configuration of the positioning device; and
    exerting a force, using an actuator, on the illumination system or the base frame, in response to the sensed vibration, in order to at least partly dampen the vibration.

17. The method of claim 16, wherein the sensor is substantially arranged in line with the force exerted by the actuator.

18. The method of claim 16, wherein the actuator comprises a first member mounted to the illumination system and a second member that is freely suspended and configured as a reaction mass.

19. The method of claim 16, wherein the actuator comprises a first member mounted to the illumination system and further comprising absorbing a reaction force of the actuator using a second member that is freely suspended and configured as a reaction mass.

20. The method of claim 16, wherein the balance mass of the balance mass configuration is configured as a reaction mass of the actuator.

* * * * *